(12) United States Patent
Higa et al.

(10) Patent No.: US 9,502,861 B2
(45) Date of Patent: Nov. 22, 2016

(54) SEMICONDUCTOR LASER

(71) Applicant: Fujitsu Optical Components Limited, Kawasaki-shi, Kanagawa (JP)

(72) Inventors: Yasutaka Higa, Chiyoda (JP); Tatsuro Kurobe, Chiyoda (JP); Masaki Wakaba, Chiyoda (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 14/825,777

(22) Filed: Aug. 13, 2015

(65) Prior Publication Data

US 2016/0064897 A1  Mar. 3, 2016

(30) Foreign Application Priority Data

Aug. 29, 2014 (JP) ................ 2014-176210

(51) Int. Cl.
| | | |
|---|---|---|
| *H01S 5/0625* | (2006.01) | |
| *H01S 5/065* | (2006.01) | |
| *H01S 5/12* | (2006.01) | |

(52) U.S. Cl.
CPC ....... *H01S 5/06256* (2013.01); *H01S 5/06258* (2013.01); *H01S 5/1206* (2013.01); *H01S 5/1225* (2013.01); *H01S 5/0654* (2013.01); *H01S 5/1221* (2013.01); *H01S 5/1231* (2013.01)

(58) Field of Classification Search
CPC ........ H01S 5/125; H01S 5/0654; H01S 5/20; H01S 5/204
See application file for complete search history.

(56) References Cited

U.S. PATENT DOCUMENTS

2002/0105990 A1   8/2002   Fish et al.
2004/0042516 A1   3/2004   Takaki et al.
2007/0263694 A1  11/2007   Fujii
2010/0265980 A1  10/2010   Matsuda
2010/0327257 A1*  12/2010   Yamamoto ............... H01S 5/12
                                                                  257/13

FOREIGN PATENT DOCUMENTS

| JP | 11-163464 | 6/1999 |
| JP | 2004-128372 | 4/2004 |
| JP | 2007-201425 | 8/2007 |
| JP | 2010-251609 | 11/2010 |
| JP | 2011-135008 | 7/2011 |

OTHER PUBLICATIONS

J-PlatPat Translation of Abstract of Japanese Patent Publication No. 2010-251609, published Nov. 4, 2010.
J-PlatPat Translation of Abstract of Japanese Patent Publication No. 2007-201425, published Aug. 9, 2007.
J-PlatPat Translation of Abstract of Japanese Patent Publication No. 2004-128372, published Apr. 22, 2004.

* cited by examiner

*Primary Examiner* — Dung Nguyen
(74) *Attorney, Agent, or Firm* — Staas & Halsey LLP

(57) ABSTRACT

A semiconductor laser includes a semiconductor substrate, an active region provided over the semiconductor substrate and having an active layer and a first diffraction grating, and a guiding region provided over the semiconductor substrate and having a guiding layer continuously extending from the active layer in an optical axis direction and a second diffraction grating continuously extending from the first diffraction grating in the optical axis direction. A grating period of the second diffraction grating is uniform, the first diffraction grating has a first part in which a grating period becomes uneven, and a grating formation density of the first diffraction grating is smaller than the grating formation density of the second diffraction grating.

6 Claims, 8 Drawing Sheets (A) EMBODIMENT (B) COMPARATIVE TECHNIQUE
(DECREASE DBR LENGTH)

(A) EMBODIMENT $\kappa 1 = 200$ cm$^{-1}$(DFB)
$\kappa 2 = 400$ cm$^{-1}$(DBR)

(B) COMPARATIVE TECHNIQUE $\kappa$ : FIXED TO 200 cm$^{-1}$

SEMICONDUCTOR LASER

CROSS-REFERENCE TO RELATED APPLICATIONS

This application is based upon and claims the benefit of priority of the prior Japanese Patent Application No. 2014-176210 filed on Aug. 29, 2014, which is incorporated herein by references in its entirety.

FIELD

The disclosures herein relate to a semiconductor laser, and particularly to a distributed reflector laser.

BACKGROUND

In recent years and continuing, distributed reflector (DR) lasers that enable single longitudinal mode oscillation have been used in high-speed fiber-optic transmission systems. As a distributed reflector laser, a semiconductor laser that integrates a distributed feedback (DFB) laser diode configured to oscillate upon current injection and a distributed Bragg reflector (DBR) laser diode serving as a reflector without current injection, is being developed. In the DFB region, only a specific wavelength is selected from the light produced at the active layer by the diffraction grating structure and this specific wavelength light reciprocates in the DFB region. The DBR region is used as a reflecting mirror provided at the rear end of the DFB active region. The diffraction grating of the DBR region reflects the specific wavelength of light.

As illustrated in FIG. 1, a distributed reflector laser is generally designed such that the lasing mode of the DFB laser comes at the center of the reflection spectrum of the DBR mirror. However, when the index of refraction increases due to the thermal effect by current injection, the Bragg wavelength of the DFB laser shifts to the long-wavelength side ("red shift") and mode hopping may occur. Moreover, when the index of refraction decreases due to carrier absorption (plasma effect), the Bragg wavelength of the DFB laser shifts to the short-wavelength side ("blue shift") and multi-mode oscillation may occur.

Some structures for preventing mode hopping or multi-mode oscillation are known. For example, the grating period of the diffraction grating of the DBR mirror is varied in the direction of the resonator to increase the DBR reflection bandwidth. See, for example, Japanese Laid-open Patent Publication No. 2010-251609. Another known technique is to bend the lines (or grooves) of the diffraction grating of the distributed reflecting mirror region such that the end parts of the lines extending in the width direction of the diffraction grating are more away from the active region than the center of the grating. In this structure, the coupling coefficient of the diffraction grating is kept constant in the width direction of the diffraction grating. See, for example, Japanese Laid-open Patent Publication No. 2011-135008.

SUMMARY

It is desired to achieve high-power single-longitudinal-mode laser oscillation.

According to an aspect of the disclosure, a semiconductor laser includes
a semiconductor substrate,
an active region provided over the semiconductor substrate and having an active layer and a first diffraction grating, and
a guiding region provided over the semiconductor substrate and having a guiding layer continuously extending from the active layer in an optical axis direction and a second diffraction grating continuously extending from the first diffraction grating in the optical axis direction,
wherein a grating period of the second diffraction grating is uniform,
the first diffraction grating has a first part in which a grating period becomes uneven, and
a grating formation density of the first diffraction grating is smaller than the grating formation density of the second diffraction grating.

The object and advantages of the invention will be realized and attained by means of the elements and combinations particularly pointed out in the claims. It is to be understood that both the foregoing general description and the following detailed description are exemplary and explanatory and are not restrictive to the invention as claimed.

DESCRIPTION OF EMBODIMENTS

Figure 1:
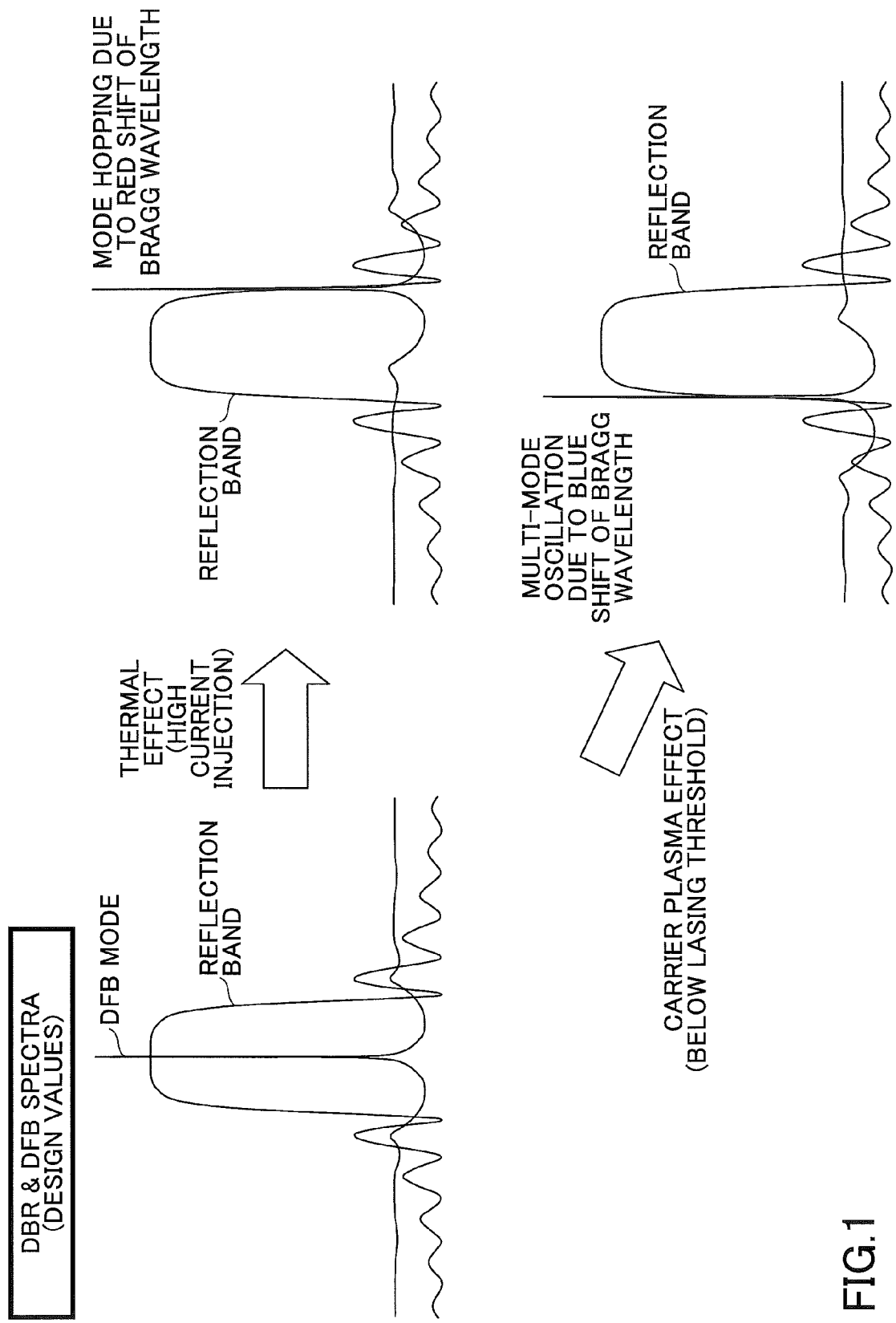
FIG. 1 is a diagram to explain mode hopping and multi-mode oscillation arising in a semiconductor laser.
Figure 2B:
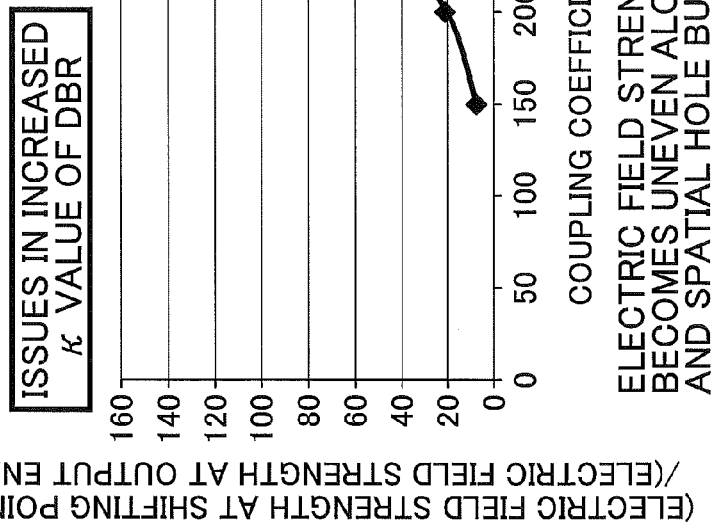
FIG. 2A and FIG. 2B are diagrams to explain technical problems arising when adjusting the reflectance of a DBR region.
Figure 2A:
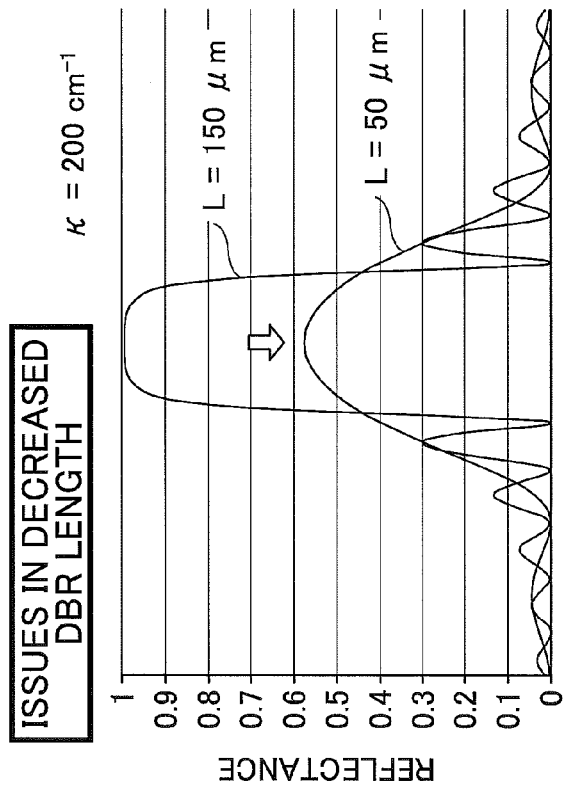

FIG. 2A and FIG. 2B illustrate technical problems found by the inventors. The reflection bandwidth of a DBR is inversely proportional to the length of the DB region in the light-guiding direction (or the optical axis direction), as illustrated in FIG. 2A. By decreasing the length L of the DBR region, the reflection bandwidth is broadened and the DFB lasing mode can be maintained within the reflection bandwidth of the DBR. However, when the length L of the DBR region is decreased, the reflectance of the DBR falls and the emission ratio of the output end to the input end of the laser decreases.

In a typical distributed reflector laser, the coupling coefficients of the DBR and the DFB are the same. If the coupling coefficient κ of the diffraction grating of the DBR is increased for the purpose of keeping the reflectance of the DBR high, the coupling coefficient of the diffraction grating of the DFB also increases. When the coupling coefficient of the DFB increases, the electric field strength at the output end of the DFB laser becomes small. Consequently, the carrier current density becomes uneven in the optical axis direction and spatial hole burning occurs, as illustrated in FIG. 2B. The vertical axis of FIG. 2B represents the ratio of the electric field strength at the maximum shifting point to the electric field strength at the DFB output end face. Along with the increase in the coupling efficient of the DBR, the coupling coefficient of the DFB increases and localized concentration of electric field becomes conspicuous.

To solve the technical problems, the embodiments provide a high-power single-longitudinal-mode semiconductor laser by preventing degradation of the reflectance of the DBR and occurrence of spatial hole burning.

<First Embodiment>

Figure 3:
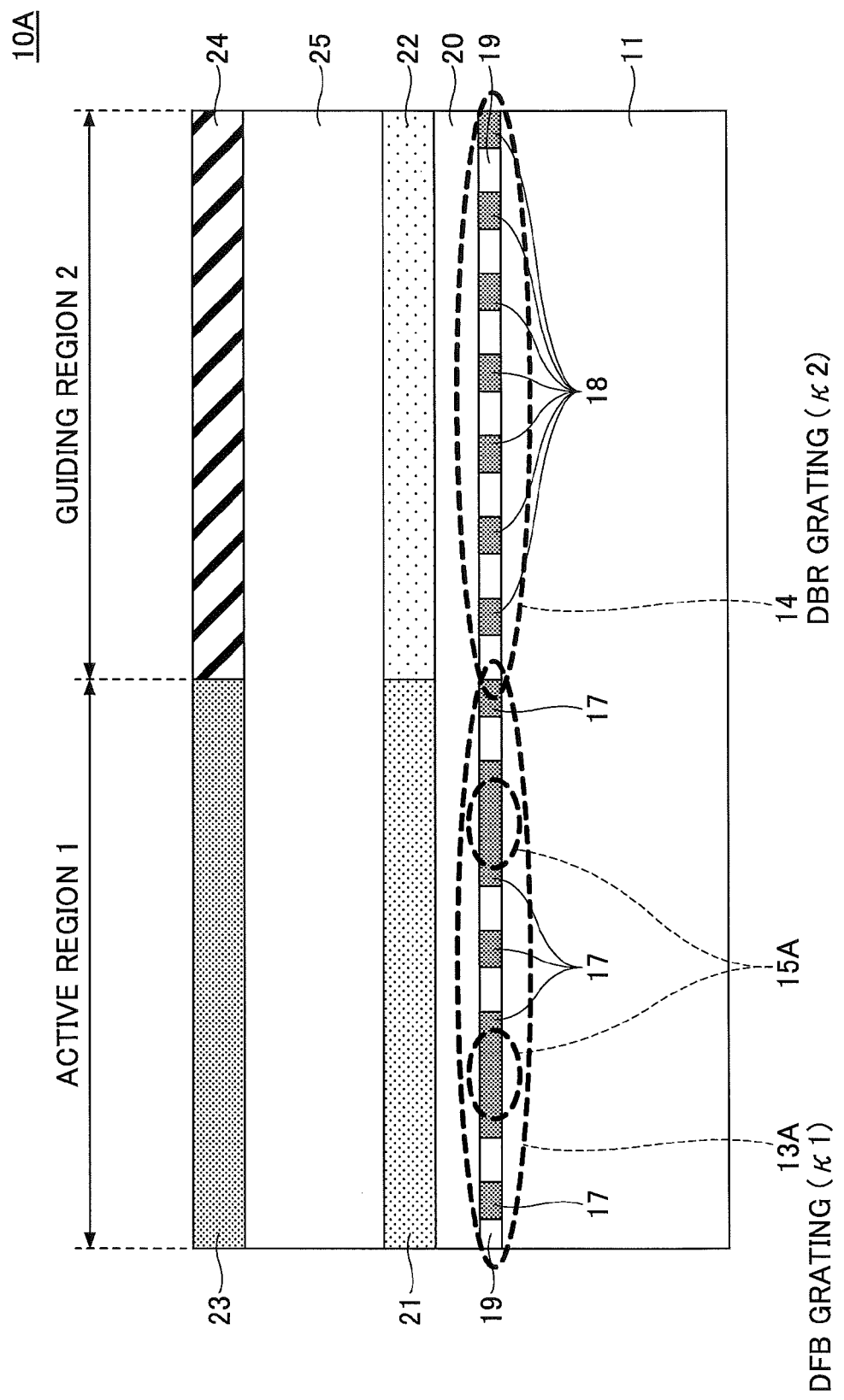
FIG. 3 is a schematic diagram illustrating a cross-sectional view of a semiconductor laser according to the first embodiment.

FIG. 3 is a schematic diagram illustrating a cross-sectional view along a light-guiding direction of a semiconductor laser 10A according to the first embodiment. The semiconductor laser 10A has an active region 1 configured to cause laser oscillation upon current injection, and a guiding region 2 configured to reflect the laser beam output from the active region 1 back to the active region 1 without current injection. The semiconductor laser 10A is a distributed reflector type laser. The active region 1 and the guiding region 2 are integrated on a semiconductor substrate 11 so as to be adjacent to each other.

The active region 1 includes an active layer 21 that produces a gain in response to current injection, and a diffraction grating 13A that has a first coupling coefficient $\kappa1$ with a first grating formation. The diffraction grating 13A is formed under the active layer 21 with a spacer layer 20 in between. Of the light produced in the active layer 21, a light beam with a specific wavelength is reflected from the diffraction grating 13A. The reflected light beam reciprocates in the active layer 21 and eventually undergoes laser oscillation. In this regard, the active region 1 may be called a "DFB laser region", and the diffraction grating 13A may be called a "DFB grating."

The guiding region 2 includes a guiding layer 22 that does not produce a gain because of no current injection, and a diffraction grating 14 that has a second coupling coefficient $\kappa2$ ($\kappa2>\kappa1$) with a second grating formation. The diffraction grating 14 is formed under the guiding layer 22 with a spacer layer 20 in between. The diffraction grating 14 reflects the light emitted from the active layer 21 back to the active layer 21. In this regard, the guiding region 2 may be called a "passive region" or "DBR mirror region", and the diffraction grating 14 may be called a "DBR grating."

The diffraction grating 13A of the active region 1 has periodically arranged line patterns 17, and thinned-out patterns 15A that make the grating period uneven by thinning out a part of the periodic structure. The spaces between the line patterns 17 and the spaces between the thinned-out patterns 15A are filled with a buried layer 19 whose refractive index is lower than that of the diffraction grating 13A. At the thinned-out patterns 15A, the frequency of change of index of refraction becomes low.

The thinned-out pattern 15A is formed so as to leave an island made of the high refractive index material. By leaving the high refractive index material that forms the island, the crystallinity of the diffraction grating 13A is maintained satisfactory on the whole. The thinned-out rate or the number of periodic changes of the refractive index to be reduced is determined in relation to the coupling coefficient $\kappa2$ of the guiding region 2, such that the coupling coefficient $\kappa1$ of the diffraction grating 13A resides in a range that can achieve a high-power single lasing mode of the semiconductor laser 10A.

The diffraction grating 14 of the guiding region 2 is formed by line patterns 18 arranged at a constant pitch. The spaces between the line patterns 18 are filled with the buried layer 19 whose refractive index is smaller than that of the line patterns 18. The diffraction grating 14 of the guiding region 2 extends continuously from the diffraction grating 13A of the active region 1. The phases of guided light components match with each other at the boundary between the guiding region 2 and the active region 1.

In the embodiment, the diffraction grating 14 of the guiding region 2 is formed at a constant pitch, and a part of the periodic repetition of the diffraction grating 13A of the active region 1 is removed or thinned out. The coupling coefficient $\kappa2$ of the DBR (of the guiding region 2) can be set greater than the coupling coefficient $\kappa1$ of the DFB laser (of the active region 1). This arrangement can prevent the reflectance of the DBR mirror from decreasing even if the length of the guiding region 2 is reduced for the purpose of broadening the reflection bandwidth of the DBR mirror. The coupling coefficient $\kappa2$ of the diffraction grating 14 of the guiding region 2 can be increased, while maintaining the coupling coefficient $\kappa1$ of the diffraction grating 13A of the active region 1 at an appropriate value, in a simple manner. Consequently, decrease of the electric field density at the output end of the DFB laser (and occurrence of spatial hole burning) can be prevented, and high power laser output is achieved.

In order to increase the coupling coefficient $\kappa2$ of the diffraction grating 14 of the guiding region 2, any suitable method may be employed. For example, the depth of the diffraction grating 14 may be increased, the distance between the guiding layer 22 and the diffraction grating 14 may be decreased, or the pitch of the diffraction grating 14 may be decreased. The diffraction grating 13A of the active region 1 is fabricated under the same design as the diffraction grating 14 of the guiding region 2. By thinning out the periodic change of the refractive index in the diffraction grating 13A, the coupling coefficient $\kappa1$ is made smaller than the coupling coefficient $\kappa2$ of the diffraction grating 14. The coupling coefficient $\kappa1$ is maintained at the optimum value by partially adjusting the periodic structure of the diffraction grating 13A. In the example illustrated in FIG. 3, the length of the guiding region 2 along the optical axis is 150 μm, the depth of the diffraction grating 14 is 100 nm, the width of the line patterns 18 in the guiding direction is 100 nm, and the spacing between the line patterns 18 is 100 nm. The length of the active region along the optical axis is 150 μm, the depth and the spacing of the line patterns 17 are the same as those of the grating pattern 18. The thinned-out rate (or the rate of reducing the number of periodic changes) of the thinned-out pattern 15A is 0.5. The "thinned-out rate" represents a ratio n/m, where "n" is the number of line patterns to be reduced and "m" is the total number of line patterns of the diffraction grating 13A before the pattern reduction (m>n).

The semiconductor laser 10A may be fabricated in the process described below. For example, a Gallium Indium Arsenide Phosphide (GaIn AsP) film is formed over the entire surface of a semiconductor substrate such as an n-type Indium Phosphide (InP) substrate. A photoresist mask (not illustrated in FIG. 2) is formed over the GaInAsP film by electron beam lithography. The photoresist mask has a pattern area corresponding to the diffraction grating 13A and a pattern area corresponding to the diffraction grating 14. By performing reactive ion etching (RIE) on the GaInAsP film through the photoresist mask, the diffraction grating 13A with the coupling coefficient $\kappa1$ and including the thinned-out pattern 15A, and the diffraction grating 14 with the coupling coefficient $\kappa2$ ($\kappa2>\kappa1$) at a constant pitch are formed simultaneously.

Then, an u-type InP film is formed over the semiconductor substrate 11 in which the diffraction grating 13A and the diffraction grating 14 have been formed, thereby successively forming the buried layer 19 to fill the spaces between the line patterns and the spacer layer 20. Then the surface of the InP film is planarized.

Then, an active layer 21 is formed over the entire surface of the planarized spacer layer 20. The active layer 21 may be formed by alternately depositing AlGaInAs quantum wells and latticed-matched barriers. Then, a hard mask covering the active region 1 is formed of silicon dioxide (SiO$_2$) or other material to remove the active layer 21 from the area other than the active region 1. Then, an AlGaInAs guiding layer 22 is grown selectively over the exposed InP spacer layer 20, and then the hard mask is removed.

Then, a p-type InP cladding layer 25 is grown over the entire surface of the wafer. Then, a highly-doped p-type GaInAs layer is formed over the InP cladding layer 25. Then the layered structure is patterned into a mesa stripe by etching the wafer using a stripe-shaped until the n-type InP substrate 11 is removed to a prescribed depth. Then the GaInAs layer is removed by etching, while maintaining the GaInAs layer in the active region 1 as a contact layer 23. Then a SiO$_2$ passivation layer 24 is formed in the area from which the GaInAs layer has been removed. Then a p-type electrode (not illustrated in FIG. 3) for current injection is formed over the GaInAs contact layer 23, and an n-type electrode is formed on the back surface of the semiconductor substrate 11 corresponding to the p-type electrode.

The process is not limited to the foregoing steps or materials as long as the diffraction grating 13A has the thinned-out pattern 15a. With the foregoing process, the diffraction grating 13A with a coupling coefficient κ1 and the diffraction grating 14 with a coupling coefficient κ2 are formed simultaneously in the active region 1 and the guiding region 2, respectively. The coupling coefficient κ2 of the diffraction grating 14 of the guiding region 2 is set greater than the coupling coefficient κ1 of the diffraction grating 13A of the active region 1. Accordingly, reflectance is maintained high and spatial hole burning is prevented even if the length of the guiding region 2 is reduced in the optical axis direction to broaden the reflection bandwidth.

<Second Embodiment>

Figure 4:
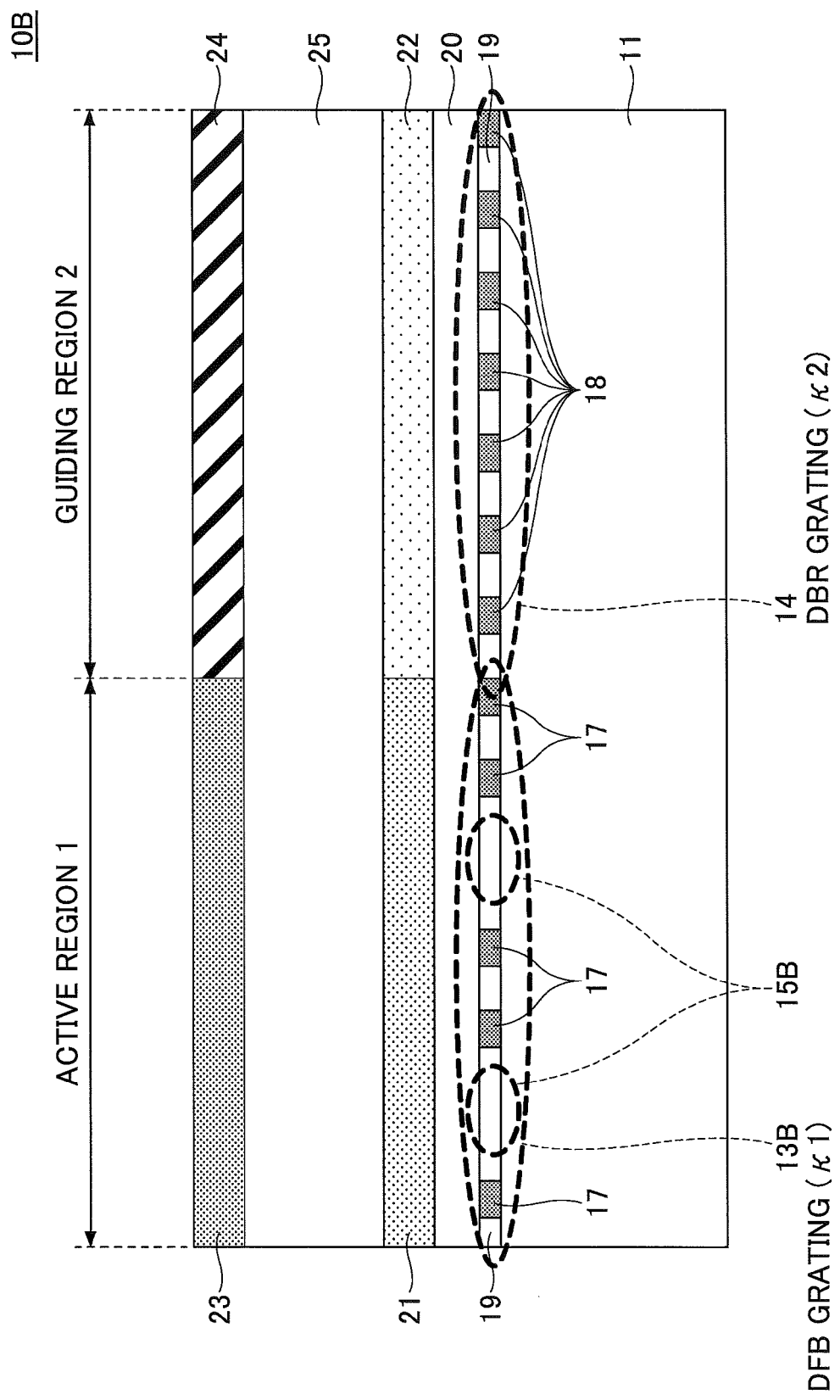
FIG. 4 is a schematic diagram illustrating a cross-sectional view of a semiconductor laser according to the second embodiment.

FIG. 4 is a schematic diagram illustrating a cross-sectional view along a light-guiding direction of a semiconductor laser 10B according to the second embodiment. The semiconductor laser 10B has an active region 1 configured to cause laser oscillation upon current injection, and a guiding region 2 configured to reflect the laser beam output from the active region 1 back to the active region 1 without current injection. The semiconductor laser 10B is a distributed reflector type laser. The active region 1 and the guiding region 2 are integrated on a semiconductor substrate 11 so as to be adjacent to each other.

The active region 1 includes an active layer 21 that produces a gain in response to current injection, and a diffraction grating 13B that has a first coupling coefficient κ1 with a first grating formation. The diffraction grating 13B is formed under the active layer 21 with a spacer layer 20 in between. Of the light produced in the active layer 21, a light beam with a specific wavelength is reflected from the diffraction grating 13B. The reflected light beam reciprocates in the active layer 21 and eventually undergoes laser oscillation.

The guiding region 2 includes a guiding layer 22 that does not produce a gain because of no current injection, and a diffraction grating 14 that has a second coupling coefficient κ2 with a second grating formation. The diffraction grating 14 is formed under the guiding layer 22 with a spacer layer 20 in between. The diffraction grating 14 reflects the light emitted from the active layer 21 back to the active layer 21. As in the first embodiment, the coupling coefficient κ2 is greater than the coupling coefficient κ1.

The diffraction grating 13B of the active region 1 has periodically arranged line patterns 17, and thinned-out patterns 15B. The thinned-out patterns 15B of the second embodiment are formed by thinning out some of line patterns 17 at a predetermined pitch (for example, eliminating every third line pattern 17). This arrangement can also reduce the number of periodic changes of the refractive index in a simple manner and the coupling coefficient κ1 is decreased.

The elimination pitch for the thinned-out patterns 15B is determined such that the coupling coefficient κ1 of the diffraction grating 13B is large enough to implement a single lasing mode of the semiconductor layer 10B and small enough to achieve a high-power output. The coupling coefficient κ1 is selected so as to satisfy these conditions, and the coupling coefficient κ2 of the diffraction grating 14 of the guiding region 2 is set greater than the coupling coefficient κ1.

With this configuration, degradation in reflectance and spatial hole burning are prevented even if the length of the guiding region 2 is reduced in the optical axis direction to broaden the reflection bandwidth.

<Verification of Advantageous Effects>

Figure 5A:
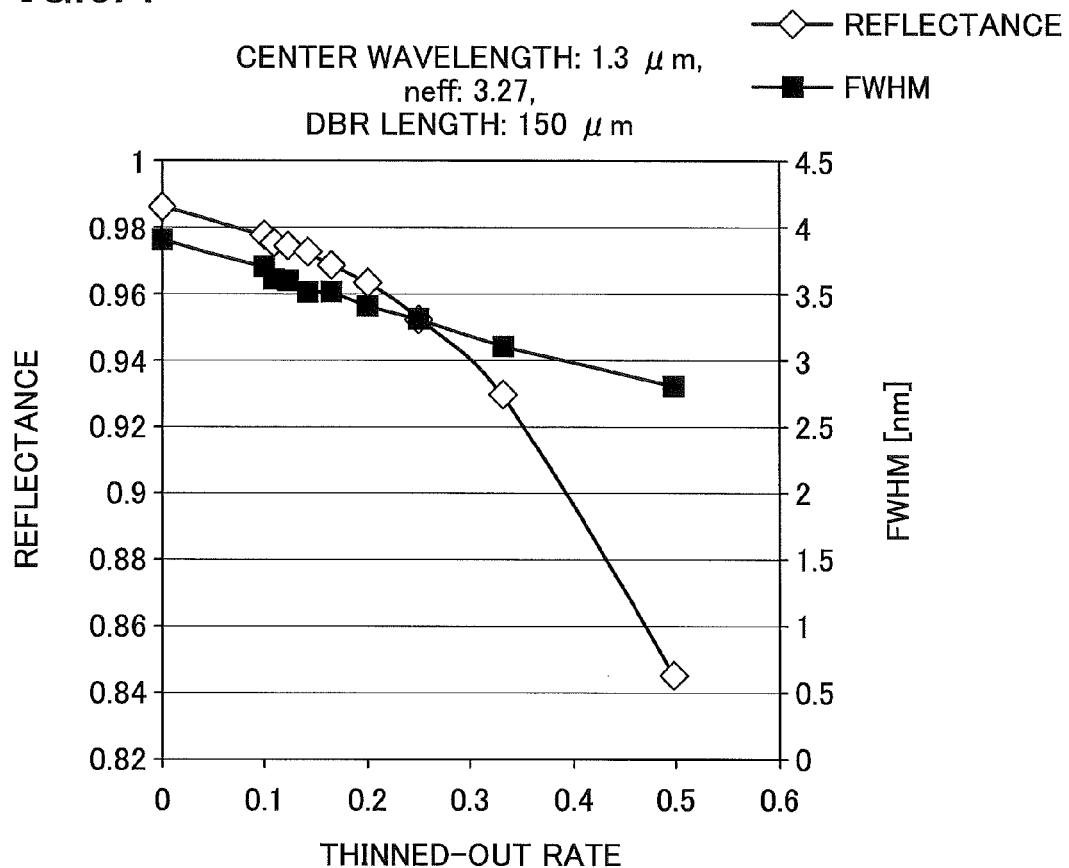
FIG. 5A and FIG. 5B are diagrams illustrating an advantageous effect of the embodiments.

FIG. 5A through FIG. 8 illustrate advantageous effects of the semiconductor laser 10A (or 10B) according to the embodiments. FIG. 5A and FIG. 5B illustrate a correlation between the thinned-out rate of diffraction grating and the coupling coefficient. As has been explained, the "thinned-out rate" is defined as a ratio n/m (m>n), where n is the number of line patterns to be removed and m is the total number of line patterns in the diffraction grating 13A or 13B before the pattern reduction.

Figure 5B:
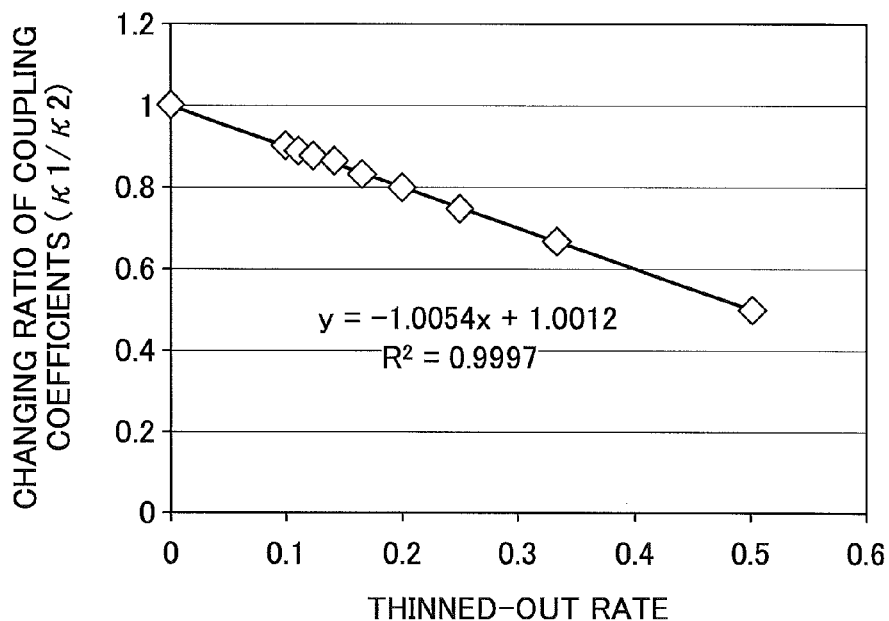

FIG. 5A illustrates reflectance and full width half maximum of the reflection spectrum of DBR (guiding region 2) as a function of thinned-out rate of DFB (active region 1). FIG. 5B illustrates changing ratio of coupling coefficient as a function of thinned-out rate.

In the Embodiment, the periodically arranged patterns are partially removed from the diffraction grating 13A or 13B, instead of entirely changing the duty cycle (the ratio of slit width to the grating period) of the diffraction grating. Accordingly, it may become difficult to express the effective coupling coefficient κ in a general expression $$\kappa = \kappa_0 (n_2 - n_1)/2,$$

where $n_1$ is the effective index of refraction of the wall of the diffraction grating, $n_2$ is the effective index of refraction of the slit of the diffraction grating, and $\kappa_0$ is the wavenumber of light in vacuum.

Because a part of the periodically arranged patterns of the diffraction grating of the active region 1 is thinned out to tune the coupling coefficient κ1 of the DFB laser, the effective coupling coefficient of the DFB laser is evaluated using a different index.

To be more precise, reflectance, which is one of the characteristics of a diffraction grating, is used as an evaluation index for the effective coupling coefficient. The reflectance of the thinned-out area of the diffraction grating, from which line patterns have been thinned out at a certain rate, is calculated by an analytical method. Then, the coupling coefficient of the periodic area of the diffraction grating that has the same reflectance without thinning out the line patterns is determined. The determined coupling coefficient is used as the effective coupling coefficient of the diffraction grating having a partially thinned-out pattern. The reflectance of the thinned-out area of the diffraction grating can be determined using a transfer matrix method typically used for reflectance analysis of a multilayer film.

The relationship between the thinned-out ratio and the reflectance determined by the above-described method is illustrate in FIG. 5A. In the analysis, the length of the DBR is 150 µm, the effective index of refraction is 3.27, the center wavelength is 1.3 µm. The right-hand side vertical axis of FIG. 5A represents the full width half maximum of the reflection spectrum of DBR. By applying the reflectance determined in FIG. 5A to a relationship between reflectance and ordinary coupling coefficient of a diffraction grating (without thinned-out patterns), the correlation of FIG. 5B between the thinned-out rate and changing ratio of coupling coefficients is derived. The vertical axis of FIG. 5B is normalized by the coupling coefficient of a diffraction grating without a thinned-out portion (the thinned-out rate is zero), and the changing ratio of the coupling coefficients is defined as κ1/κ2.

As is understood from FIG. 5A and FIG. 5B, by increasing the thinned-out rate from zero to 0.5, the ratio of coupling coefficient κ1 to κ2 can be decreased. From the viewpoint of maintaining the reflectance high, the preferred range of the thinned-out rate is from 0.1 to 0.35.

Figure 6:
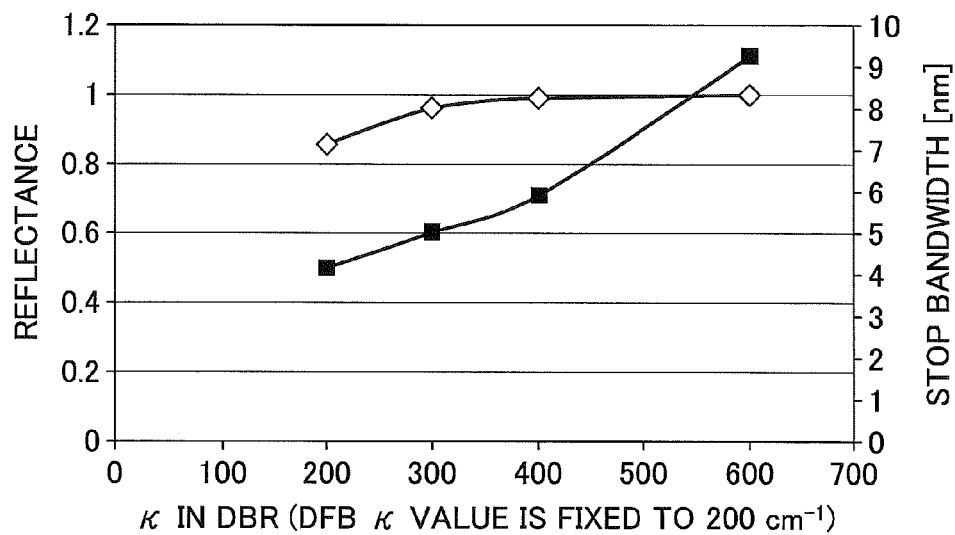
FIG. 6 illustrates an advantageous effect of the embodiments compared with a conventional technique.
Figure 6:
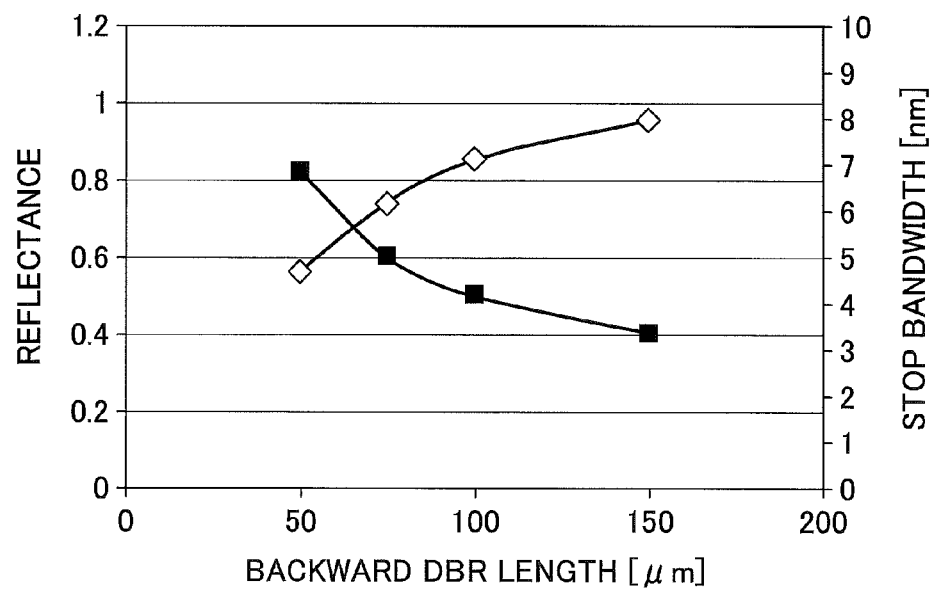

FIG. 6 illustrates another advantageous effect of the embodiment (at the top part (A) of the figure), compared with the conventional technique of reducing the DBR length (at the bottom part (B) of the figure). With the conventional method to reduce the DBR length, the peak reflectance falls as the stop bandwidth (on the right-hand side vertical axis) is increased. In contrast, in the embodiment, the peak reflectance does not fall even if the stop bandwidth is broadened. This is because the coupling coefficient κ2 of the DBR grating (of the guiding region 2) is maintained high by thinning out only the DFB grating (of the active region 1). In the analysis, the coupling coefficient κ1 of the DFB grating is fixed to 200 cm$^{-1}$, and the coupling coefficient κ2 of the DBR grating is gradually increased. Under this condition, the stop bandwidth which is the reflection bandwidth for blocking transmission is broadened, while maintaining the reflectance high. The lasing mode is maintained within the reflection band even if red shift due to thermal effect or blue shift due to carrier plasma effect occurs. Consequently, mode hopping or multimode oscillation is prevented and high power output can be achieved.

Figure 7:
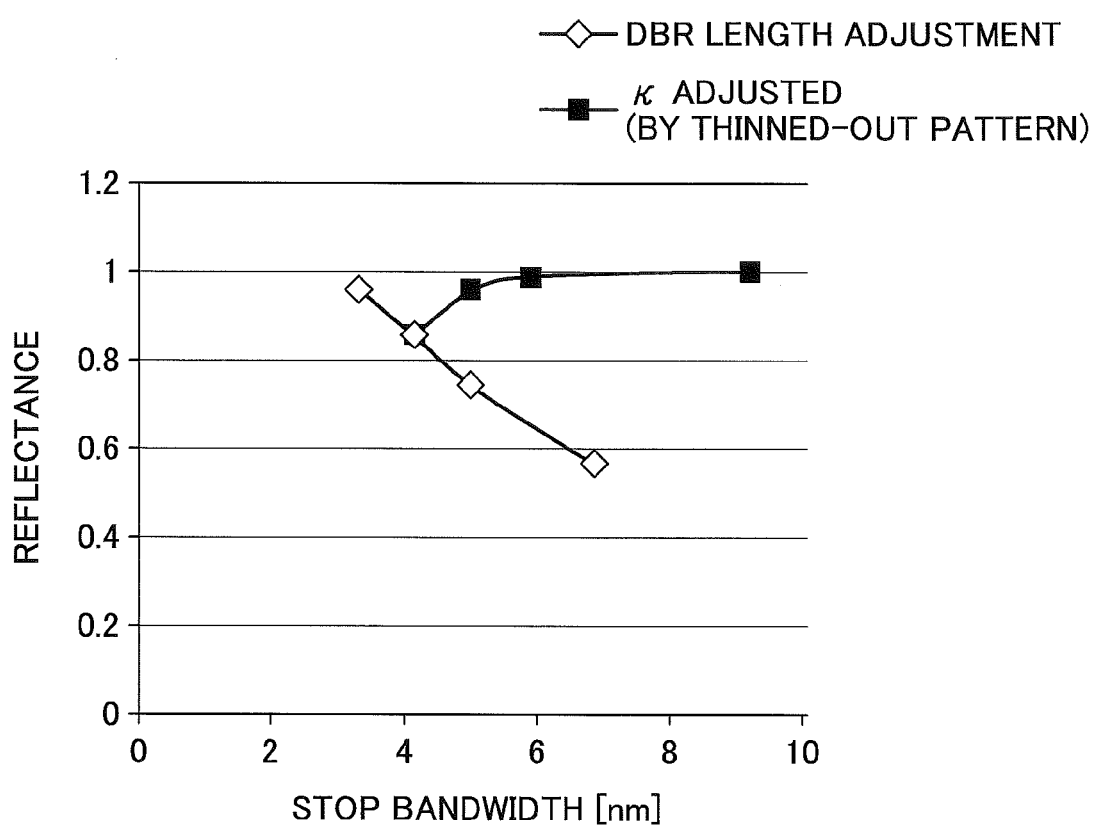
FIG. 7 illustrates an advantageous effect of the embodiments compared with a conventional technique.

FIG. 7 illustrates the comparison result of FIG. 6. The horizontal axis represents stop bandwidth, and the vertical axis represent reflectance. The dark square symbols indicate reflectance of the semiconductor laser of the embodiments using a κ value adjusted by thinned-out pattern. The white diamond symbols indicate reflectance of the conventional laser with the DBR length adjusted. As clearly illustrated in FIG. 7, with κ value adjustment by thinning out a portion of the grating pattern according to the embodiments, the reflectance is maintained high even if the stop bandwidth is broadened.

Figure 8:
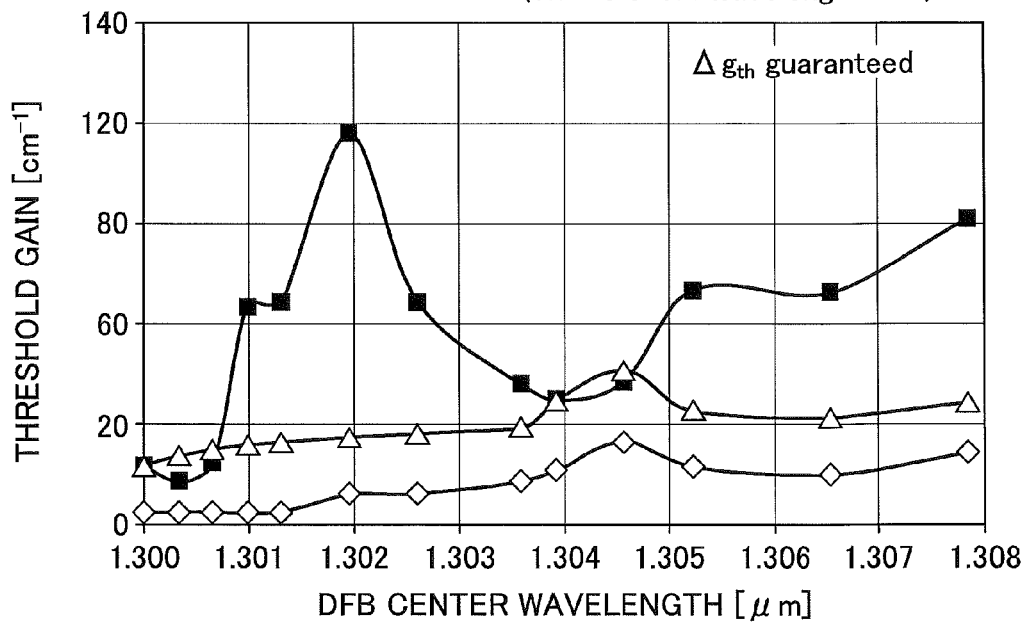
FIG. 8 illustrates an advantageous effect of the embodiments compared with a conventional technique.
Figure 8:
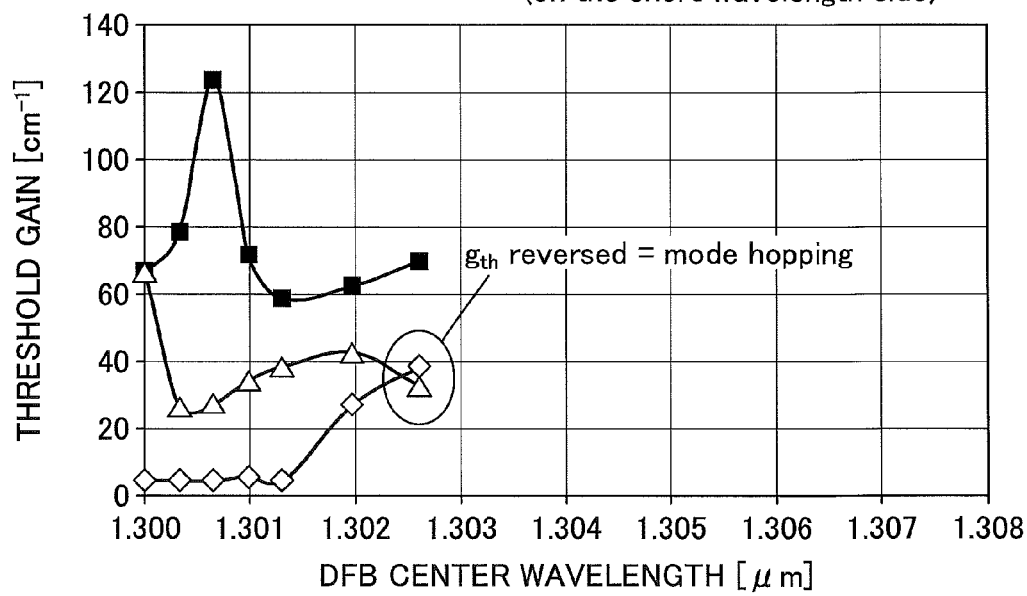

FIG. 8 illustrates a relationship between the DFB center wavelength and threshold gain "$g_{th}$" of the semiconductor laser of the embodiment (top part (A) of the figure), compared with the comparative technique using a fixed coupling in common for DFB and DBR regions (bottom part (B) of the figure).

In the graph (A) of the embodiment, at the DFB center mode indicated by white diamond symbols, the threshold gain does not rise even if the DFB center wavelength shifts. Accordingly, the threshold gain of the DFB center mode is maintained below the threshold gains of the adjacent modes (on the long and short wavelength sides). Accordingly, mode hopping is prevented.

In contrast, in graph (B) of the comparative technique, the threshold gain of the DFB center mode and that of the adjacent mode on the short wavelength side are reversed when the DFB center wavelength shifts to the long wavelength side. In this case, the laser oscillates at the short-wavelength-side adjacent mode.

As has been described, the semiconductor laser of the embodiments can prevent lowering of the DBR reflectance and occurrence of spatial hole burning. As a result, high-power and single-longitudinal-mode laser oscillation is achieved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present inventions have been described in detail, it should be understood that the various changes, substitutions, and alterations could be made hereto without departing from the spirit and scope of the invention.

What is claimed is:

1. A semiconductor laser comprising:
   a semiconductor substrate;
   an active region provided over the semiconductor substrate and having an active layer and a first diffraction grating; and
   a guiding region provided over the semiconductor substrate and having a guiding layer continuously extending from the active layer in an optical axis direction and a second diffraction grating continuously extending from the first diffraction grating in the optical axis direction,
   wherein a grating period of the second diffraction grating is uniform,
   the first diffraction grating has a first part in which a grating period becomes uneven,
   a grating formation density of the first diffraction grating is smaller than a grating formation density of the second diffraction grating, and
   in the first part of the first diffraction grating, periodically arranged line patterns are thinned out at a predetermined pitch.

2. The semiconductor laser according to claim 1, wherein the first part of the first diffraction grating has one or more broadened line patterns, a width of each of the broadened line patterns being increased in the optical axis direction.

3. The semiconductor laser according to claim 1, wherein the first part of the first diffraction grating has one or more broadened slits, a width of each of the broadened slits being increased in the optical axis direction.

4. The semiconductor laser according to claim 1, wherein in the first part of the first diffraction grating, a thinned-out rate of the line patterns ranges from 0.1 to 0.35.

5. The semiconductor laser according to claim 1, wherein the first diffraction grating has a second part with a uniform grating period other than the first part, and a grating period of the second part of the first diffraction grating is the same as the grating period of the second diffraction grating.

6. The semiconductor laser according to claim 1,
wherein the first diffraction grating is positioned under the active layer in a direction perpendicular to a surface of the semiconductor substrate, and
wherein the second diffraction grating is positioned under the guiding layer in the direction perpendicular to the surface of the semiconductor substrate.

* * * * *